United States Patent [19]
Sun et al.

[11] Patent Number: 5,930,618
[45] Date of Patent: Jul. 27, 1999

[54] METHOD OF MAKING HIGH-K DIELECTRICS FOR EMBEDDED DRAMS

[75] Inventors: Shih-Wei Sun, Taipei; Tri-Rung Yew, Hsin-Chu, both of Taiwan

[73] Assignee: United Microelectronics Corp.

[21] Appl. No.: 08/943,670

[22] Filed: Oct. 3, 1997

Related U.S. Application Data

[60] Provisional application No. 60/054,621, Aug. 4, 1997.

[51] Int. Cl.$^6$ .................................................. H01L 21/8242
[52] U.S. Cl. ........................................... 438/240; 438/241
[58] Field of Search ...................................... 438/210, 240, 438/241, 253, 396

[56] References Cited

U.S. PATENT DOCUMENTS

| | | | |
|---|---|---|---|
| 5,296,399 | 3/1994 | Park | 438/241 |
| 5,324,680 | 6/1994 | Lee et al. | 438/241 |
| 5,332,687 | 7/1994 | Kuroda | 438/241 |
| 5,554,556 | 9/1996 | Ema | 438/253 |
| 5,731,234 | 3/1998 | Chen | 438/241 |

*Primary Examiner*—Chandra Chaudhari
*Attorney, Agent, or Firm*—Rabin & Champagne, P.C.

[57] ABSTRACT

An integrated circuit device having both an array of logic circuits and embedded DRAM circuits is provided using a process that avoids some of the most significant processing challenges for embedded DRAM integration. Transfer FETs and wiring lines are provided for the embedded DRAM circuits and FETs are provided for the logic portions of the device. A thin, conformal oxide layer is provided over the surface of the device to cover the transfer FETs and the logic FETs to protect portions of the device during formation of the charge storage capacitors. A mask is provided having openings over the appropriate source/drain regions of the transfer FETs and the oxide layer is etched. A planar or substantially planar lower capacitor electrode is defined by providing and patterning a first layer of doped polysilicon over the thin protective oxide layer in contact with the desired source/drain regions of the transfer FETs. Tantalum pentoxide or barium strontium titanate might be used as the capacitor dielectric to provide the needed capacitance for the cells of the embedded DRAM array. An upper capacitor electrode is provided and the protective oxide layer is removed from the logic circuits. Because the protective oxide layer is thinner and more uniform than is conventional, it is easier to perform this etching step without damaging the FETs of the logic circuit. A conventional salicide process can then be used to complete formation of the FETs of the logic circuits of the device.

28 Claims, 4 Drawing Sheets

METHOD OF MAKING HIGH-K DIELECTRICS FOR EMBEDDED DRAMS

This application claims priority from provisional application Ser. No. 60/054,621, filed Aug. 4, 1997.

BACKGROUND OF THE INVENTION

1. Field of the Invention

The present invention relates to the formation of integrated circuit devices that incorporate both an array of memory cells and an array of logic circuits on a single chip or substrate.

2. Description of the Related Art

For some data processing applications, it has become desirable to provide integrated circuit devices that incorporate on the same chip both arrays of memory cells and arrays of high speed logic circuits like those typically used in microprocessors or digital signal processors. It might, for example, be desirable to provide an array of dynamic random access memory cells within the integrated circuit device to provide dedicated, comparatively high speed access to a significant amount of data storage for the logic circuits of the integrated circuit device. Applications that could benefit from the provision of such embedded DRAM include logic circuits that process large amounts of data, such as graphics processors. Providing both high speed logic circuits and embedded DRAM on the same chip requires that certain aspects of the process flow used for making the chip be dedicated to the formation of logic circuits and that other aspects be dedicated to the formation of memory cells. FIGS. 1–4 illustrate a portion of a process flow that might be used to provide embedded DRAM on an integrated circuit device that includes high speed logic circuits.

Figure 1:
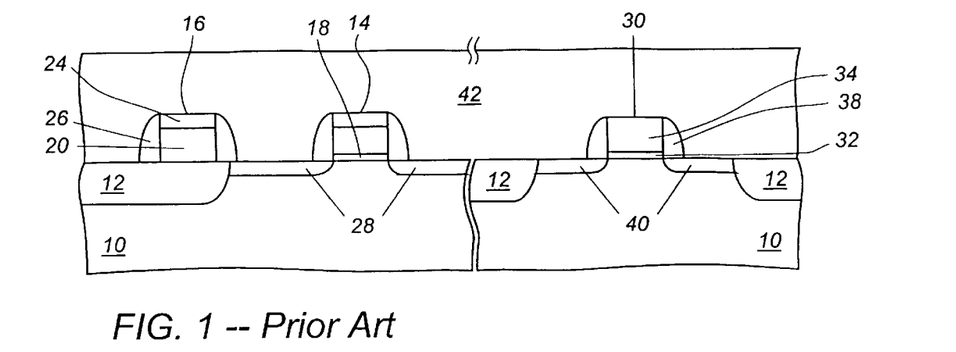
FIGS. 1–4 illustrate steps in a conventional process for forming an embedded DRAM integrated circuit device.

FIG. 1 illustrates an integrated circuit device at an intermediate processing stage that will include embedded DRAM and an array of logic circuits. On the left side of the illustrated device is an exemplary DRAM cell and on the right side of the illustrated device is an exemplary logic FET that makes up part of a logic circuit. Other circuitry for performing input/output (I/O) functions for the integrated circuit device would typically be included, but is not shown here.

The embedded DRAM cell, when complete, will include a transfer or pass field effect transistor (FET) coupled to a charge storage capacitor. The transfer FET acts as a switch for selectively coupling the lower electrode of the charge storage capacitor to a bit line so that data can either be read from or stored to the charge storage capacitor. The embedded DRAM and logic circuits of the integrated circuit device are formed on a single silicon substrate 10, which typically has at least a surface layer of P-type material. Device isolation regions 12 are provided as necessary across the surface of the device. The illustrated device isolation regions 12 may be field oxide regions formed in a modified local oxidation of silicon (LOCOS) process or may be shallow trench isolation (STI) devices consisting of trenches filled with oxide by chemical vapor deposition (CVD). The illustrated cross section of the embedded DRAM cell includes a section through a transfer FET 14 and through an adjacent wiring line 16. The wiring line 16 is typically an extension of the gate electrodes for adjacent DRAM cells and so has an almost identical structure to the gate electrode 14. The primary difference between the gate electrode 14 and the wiring line 16 is the presence of a gate oxide layer 18 that separates the gate electrode from the active device region of the substrate 10. No gate oxide layer is formed beneath the illustrated wiring line because the wiring line is positioned over the oxide of the illustrated field oxidation region 12. A capping oxide layer 24 is provided early in processing to protect the gate electrode and wiring line. Oxide spacer structures 26 are provided on either side of the gate electrode and wiring lines, typically by CVD oxide deposition followed by an etch back process. Oxide spacer structures 26 provide lateral protection to the gate electrode and wiring line during processing and might also be used in the formation of lightly doped drain (LDD) structures for the source and drain regions of the transfer FETs. Source/drain regions 28 are formed by self-aligned ion implantation of N-type dopants on either side of the gate electrode 14 to complete the transfer FET.

Portions of the logic circuitry, schematically illustrated on the right of FIGS. 1–4, are formed nearly contemporaneously with the formation of the transfer FETs of the DRAM array. Depending on design choices, some processing steps may be shared between the embedded DRAM and logic formation processes or wholly distinct processes might be used for forming the DRAM and logic circuits. The exemplary FET 30 of the logic circuit is formed on a gate oxide layer 32 and includes a polysilicon gate electrode 34. It is generally preferred to not provide a silicide layer over the polysilicon gate electrode layer 34 at the illustrated stage of the manufacturing process. Instead, it is generally preferred to use a self-aligned silicide ("salicide") process to form the FETs of the logic circuit at a late stage in the manufacturing process. Oxide spacers 38 are formed on either side of the gate electrode 34 and are typically used in defining an LDD structure for the source/drain regions 40 of the logic FETs.

After formation of the FETs for the DRAM array and the logic array, it is typical to provide a thick oxide layer 42 over the entire substrate 10. The oxide layer is deposited to a sufficient thickness to both cover the various device structures and to provide a sufficient thickness for the planarization of the oxide layer 42. Planarization of the oxide layer 42 is important to improve the process latitude for the photolithography and etching steps used to form the charge storage capacitor. After provision of the planarized oxide layer, a via 44 is formed through the planarized oxide layer to expose the source/drain region 28 to which the charge storage capacitor of the illustrated DRAM cell will be connected. Doped polysilicon is provided within via 44 to form a vertical interconnect 46 between the source/drain region 28 and the lower electrode 48 of the charge storage capacitor. The lower electrode 48 of the charge storage capacitor is typically formed from several layers of doped polysilicon. For the design rules typically used in modern processes, it is important to provide a three dimensional crown or fin capacitor structure for the lower electrode 48 so that it has sufficient surface area to provide a sufficient level of charge storage for the capacitor. Such a crown or fin structure is necessary to ensure that the charge storage capacitor of the DRAM cell stores a sufficiently large charge to facilitate data reading and writing operations as well as to ensure that the stored charge remains on the charge storage capacitor for an acceptable amount of time without requiring a refresh operation. Formation of the charge storage capacitor continues by providing a capacitor dielectric 50 consisting of the three layer oxide/nitride/oxide structure known as ONO over the lower capacitor electrode 48. An upper electrode 50 is formed by providing another layer of doped polysilicon which is patterned in a manner conventional to DRAM arrays. The completed charge storage capacitor is shown in FIG. 2.

Figure 2:
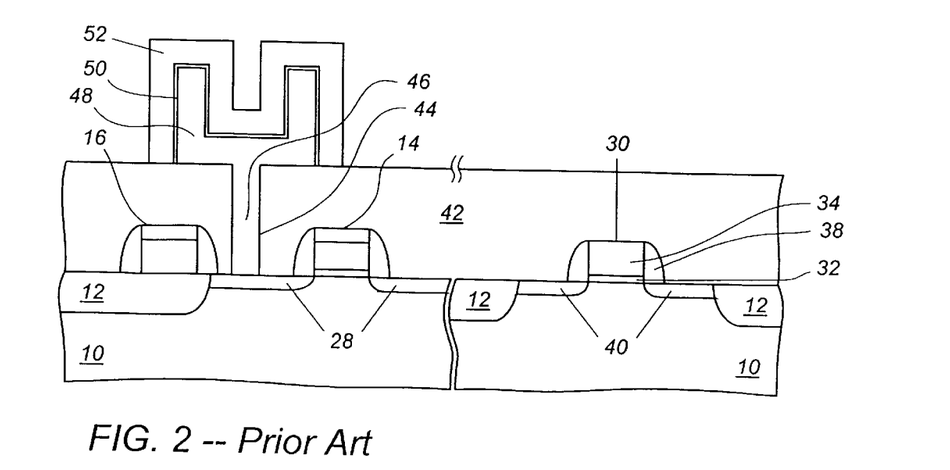

After completion of the charge storage capacitor, a mask such as photoresist mask 54 is provided over the FIG. 2 device to cover the embedded DRAM array and to expose the oxide layer 42 over the array of logic circuitry. Etching is performed to remove the thick oxide layer 42 from above the logic circuitry, resulting in the structure shown in FIG. 3. Processing continues on the logic FET 30 to form a silicide layer 66 over the gate electrode 34 and silicide layers 68 over the source/drain regions 40. The silicide layers 66, 68 reduce the resistivity and contact resistance of the gate electrode and the source/drain regions. Typically, the silicide layers are formed in a self-aligned ("salicide") process in which a layer of a refractory metal such as titanium is deposited over the exposed polysilicon gate electrode and the exposed silicon source/drain regions. An initial anneal is performed to convert a portion of the deposited metal layer to a metal silicide. An etch is performed to remove unreacted metal and then a second anneal is performed to achieve a low resistivity for the metal silicide layers 66, 68 on the gate electrode and source/drain regions. Processing continues to complete the integrated circuit device which provides both logic circuitry and embedded DRAM circuitry.

To date, providing embedded DRAM for the logic circuits of an integrated circuit device to enhance the performance of the logic circuits and the device as a whole has been an expensive process which significantly reduces the yields for the desired integrated circuit device. It is accordingly desirable to provide a better process for forming embedded DRAM structures.

SUMMARY OF THE PREFERRED EMBODIMENTS

Aspects of the present invention provide a method of making an integrated circuit device including both embedded memory and logic circuits on a single substrate. A substrate is provided having transfer FETs formed in and on embedded memory regions of the substrate and having logic FETs formed in and on logic circuit regions of the substrate. A conformal protective layer is provided over the transfer FETs and over the logic FETs, with the conformal protective layer having about the same thickness over gate electrodes of the logic FETs and over the source/drain regions of the logic FETs. A portion of the conformal protective layer is removed to form a contact opening exposing a source/drain region of one of the transfer FETs.

A lower capacitor electrode is provided in contact with the source/drain region of the one transfer FET and a capacitor dielectric layer and a upper capacitor electrode are provided over the lower capacitor electrode to form a charge storage capacitor for the one transfer FET. The conformal protective layer is removed from at least portions of the logic circuit regions.

DETAILED DESCRIPTION OF THE PREFERRED EMBODIMENTS

There are a variety of processing constraints on the conventional embedded DRAM process illustrated in FIGS. 1–4. The process used to uncover the FETs of the logic circuitry after formation of the DRAM capacitor, that is, the process which removes oxide layer 42 and converts the FIG. 2 structure into the FIG. 3 structure, is a particular source of problems. Oxide layer 42 is made thick to achieve the desired level of planarization and to sufficiently protect the various memory and logic circuits during the etching steps used to form the crown or fin structure of the charge storage capacitor. Because the oxide layer 42 tends to be thick, the removal of oxide layer 42 from the logic circuits is a prolonged etching process. The polysilicon gate electrode 34 extends above the source/drain regions 40 of the substrate by about 2000 Å and, quite possibly, by as much as 4000–5000 Å. Etching to remove the oxide layer 42 therefore must continue through one thickness of oxide over the gate electrode and a greater thickness of oxide over the source/drain regions. The etching process must be continued until the source/drain regions are exposed, so that the effect of etching the oxide layer 42 is to expose the gate electrode to the etching process for a longer period of time. Thus, the etching process inevitably leads to loss of polysilicon from the gate electrode and damage to the gate electrode from the plasma etching process. Polysilicon loss and gate electrode processing damage has been observed to reduce the performance and yields of logic circuits in embedded DRAM integrated circuit devices.

Figure 3:
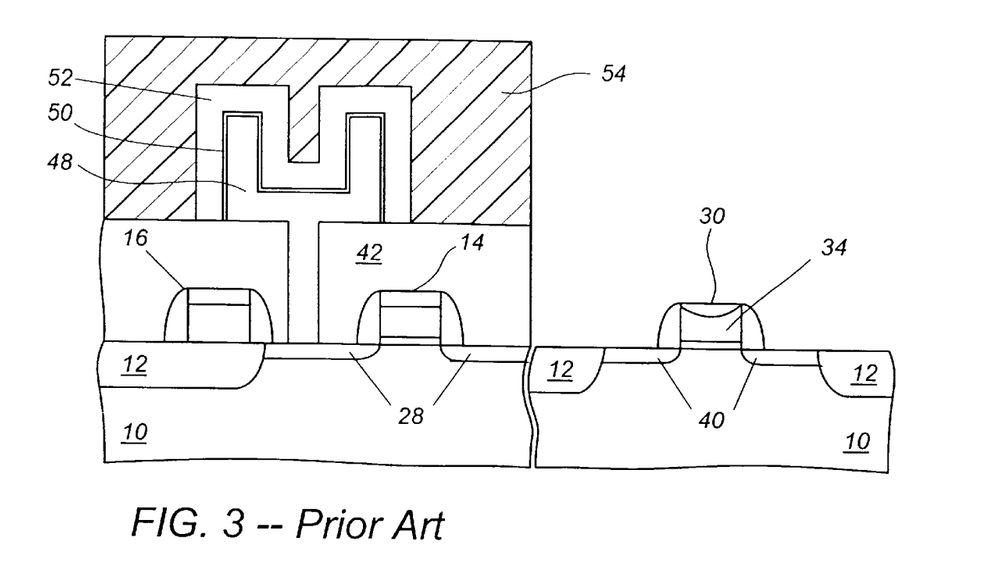
Figure 4:
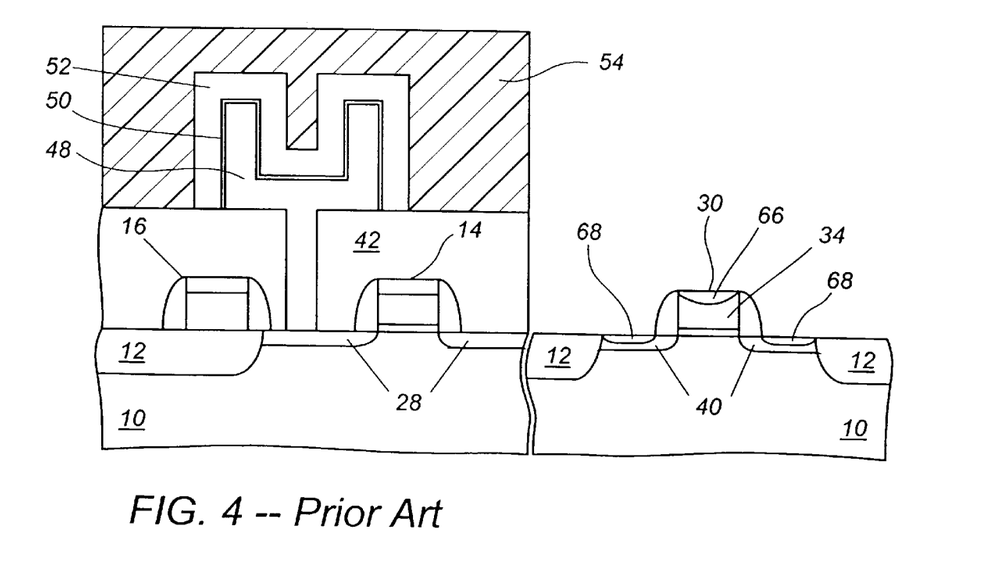

One alternative to the lengthy etch process used to expose the conductive portions of the logic FETs of the logic circuits shown in FIG. 3 is to complete formation of the logic FETs circuits before forming the charge storage capacitor. For example, the FETs of the logic circuit might be completed before the thick oxide layer 42 is provided over the FIG. 1 structure, thereby eliminating the need to perform a blanket etch to expose the gate and source/drain regions of the FET at the same time. This strategy is unworkable, however. Completion of the FETs of the logic circuit requires that the silicide layers 66, 68 be provided on the gate electrode 34 and source/drain regions 40, respectively. The metals provided in these silicide layers 66, 68 typically diffuse rapidly through silicon during high temperature processing steps. Such high temperature processing steps are required in the formation of the DRAM charge storage capacitors because the nitride deposition process and the subsequent oxidation process used in forming the ONO capacitor dielectric typically require extended exposures to temperatures in excess of 700° C. Such high temperature processes can create a wide array of problems for the silicide layers 66, 68 and may render inoperative the FETs 30 of the logic circuit. As such, another strategy to improve the yields of the process of FIGS. 1–4 is required.

Preferred embodiments of the present invention produce an integrated circuit device having both logic circuits and embedded DRAM circuits using a process that avoids some of the most significant processing challenges for embedded DRAM integration. According to such preferred embodiments, an initial process forms transfer FETs and wiring lines for the portion of the device dedicated to embedded DRAM circuits and forms logic FETs for the portion of the device dedicated to logic circuits. A thin, conformal protective layer is provided over the surface of the device to cover the transfer FETs and the logic FETs. Most preferably, the thin protective layer is a layer of CVD oxide having a thickness of less than about 2000 Å. This thin, conformal oxide layer remains on the logic portions of the integrated circuit device to protect the logic circuits during the processing used to form the charge storage capacitors of the embedded DRAM circuits. A mask is provided having openings over the appropriate source/drain regions of the transfer FETs and the protective oxide layer is removed to expose only the desired source/drain regions.

A planar or substantially planar lower capacitor electrode is defined by providing a first layer of doped polysilicon over the thin protective oxide layer and in contact with the desired source/drain regions of the transfer FETs. The first layer of doped polysilicon is patterned to define the lateral extent of the lower capacitor electrodes. Most preferably, no fin or crown structure is formed for the lower electrodes of the embedded DRAM charge storage capacitors. The capacitance needed to achieve acceptable DRAM performance is provided not by the typical three dimensional fin or crown capacitor electrode structure, but is instead provided by using a high dielectric constant capacitor dielectric. For example, tantalum pentoxide or barium strontium titanate might be used as the capacitor dielectric to provide the needed capacitance for the cells of the embedded DRAM array. An upper capacitor electrode is provided from a second layer of doped polysilicon and then the thin protective oxide layer is removed from the logic circuits of the device. By not forming a complex fin, crown or other three dimensional structure for the charge storage capacitor, the processing demands of forming the charge storage capacitor are significantly reduced. In particular, the simpler structure of the charge storage capacitor makes it possible to use a thin conformal oxide layer as a protective layer rather than the thick, planarized oxide layer conventionally used. Because the protective oxide layer has a more uniform thickness and is thinner than would be necessary when using a fin, crown or other complex capacitor electrode structure, it is easier to perform the etching step to remove the protective layer without damaging the FETs of the logic circuit. A conventional salicide process can then be used to complete formation of the FETs of the logic circuits of the device.

Particularly preferred embodiments of the present invention achieve and improve yields by reducing the extent of and making more uniform the etching process used to expose the FETs of a logic circuit after formation of the charge storage capacitors of the embedded DRAM array. This improvement relates to the fact that the oxide protective layer has the same, comparatively smaller thickness over both the gate electrode and the source/drain regions. As such, the total etch time will be shorter and the gate electrode will be exposed to the etching environment for a shorter amount of time. Since the oxide layer is needed to protect the logic and memory FETs primarily during the etching of the polysilicon capacitor electrode(s), it is possible for this protective oxide layer to be on the order of a few hundred angstroms in thickness, depending on the selectivity of the etch used to remove the polysilicon. To ensure good processing margins, however, it may be desirable to provide a protective oxide layer having a thickness of between about 1000–2000 Å, but in any case the protective oxide layer will be more uniform and thinner than the oxide layer 42 illustrated in FIG. 1. Importantly, the surface of the protective oxide layer or other protective layer provided in accordance with the present invention will be conformal to the surface of the device structures in the logic circuits. While the gate electrode 34 of the logic FET is exposed to the etching environment for a longer time than the source/drain regions 40 in the process illustrated in FIGS. 2–3 for etching the planarized oxide layer 42, preferred embodiments of the present invention will cause the gate electrode and the source/drain regions to be exposed to the etching environment for approximately the same amount of time during removal of the protective layer. This reduces the amount of polysilicon loss from the gate electrode and reduces the amount of plasma processing damage to the gate electrode, without introducing similar problems to the source/drain regions of the logic FETs. Both the performance of the FETs of the logic circuits and the yields of the embedded DRAM integrated circuit devices will be improved. These and other aspects of the present invention are now described in greater detail with reference to FIGS. 5–8.

Aspects of the present invention are described with reference to a particular example of a processing circuit incorporating on a single chip embedded DRAM, high speed logic circuitry and, as required, I/O circuitry capable of operating at higher voltages than the logic circuitry. Such higher operating voltage I/O circuits are desirable when the logic circuits of the integrated circuit device operate at a reduced internal operating voltage but the integrated circuit device as a whole must interface with outside circuits that operate at higher voltages or which must be driven with higher currents. The formation of the I/O circuits that might be provided for the illustrated integrated circuit device is not shown since, within the context of explaining the present invention, the formation of the I/O circuits will generally be similar to the methods used in manufacturing the illustrated logic circuits. Various stages in the formation of a cell of an embedded DRAM array are illustrated on the left side of FIGS. 5–8 and various stages in the formation of a logic FET characteristic of a high speed logic circuit are illustrated on the right side of FIGS. 5–8. In the illustrated embodiments, the embedded DRAM and logic circuits are formed on the P-type surface of a substrate 100 that is provided with shallow trench isolation structures 102. Shallow trench isolation regions 102 are formed around the devices of both the embedded DRAM circuits and the logic circuits by etching trenches into substrate 100 and then refilling the trenches using chemical vapor deposited (CVD) oxide. A variety of implantations including, for example, field implantations, antipunchthrough implantations and implantations to form P-well and N-well regions for NMOS, PMOS and CMOS circuitry within the logic and I/O circuits are also performed in the initial stages of the manufacture of the illustrated device.

After the various preparatory processing steps, the gate oxide layers and gate electrodes of the FETs of the various DRAM, logic and I/O circuits are provided. It is possible that the processing steps used in the formation of the FETs in these various circuits could be different to provide the different operational characteristics that may be preferred for each of these circuits. It might, for example, be desirable to provide the different FETs with different operating voltages, switching characteristics and different leakage characteristics. The FETs of the logic circuits might be designed to feature high speed and low power operation, which might require low operating voltages of about 1.8–2.5 V and a gate oxide thickness of about 40 Å. The I/O circuits might feature higher operating voltages such as about 3.3 V and larger drive currents, both of which might be facilitated by providing an intermediate gate oxide thickness such as about 75 Å. Finally, the transfer FETs of the array of embedded DRAM cells might be designed to have a low level of leakage and so might be formed to have a gate oxide layer of approximately 100 Å or more in thickness. Provision of these different thicknesses of gate oxides can be accomplished by various conventional processes that cause the substrate in the different portions of the device to be exposed to a thermal oxidation environment for different amounts of time. As gate oxide layers are formed in the different sections of the integrated circuit device, it is preferred that the gate oxide layers be protected by depositing polysilicon on the newly formed gate oxide layers. Preferably, this layer of polysilicon is incorporated into the gate electrodes for the transfer FETs in the embedded DRAM regions and the logic FETs in the logic circuit sections of the integrated circuit device.

Figure 5:
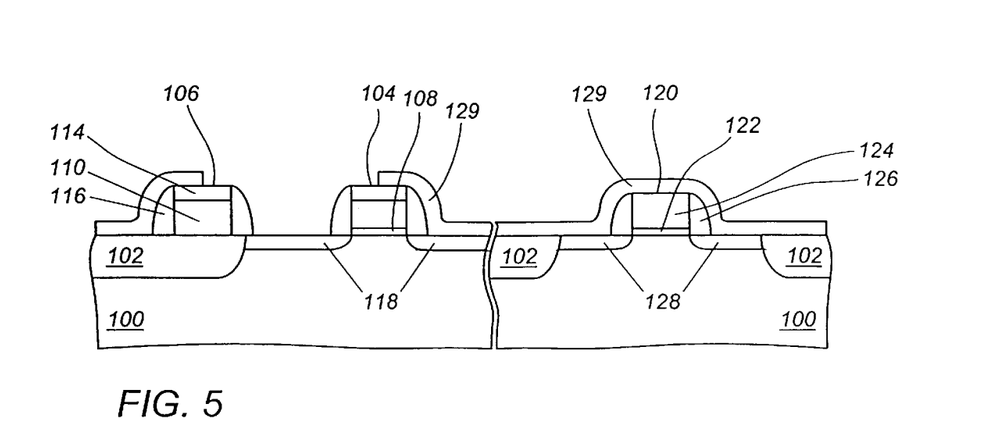
FIGS. 5–8 illustrate steps in a preferred process for forming an integrated circuit device in accordance with preferred embodiments of the present invention.

The transfer FET 104 and wiring line 106 of the embedded DRAM shown on the left of the FIG. 5 are formed starting with the blanket deposition of a polysilicon layer to a thickness of between about 1500–3500 Å over the gate oxide layer 108. The polysilicon layer is doped N-type by ion implantation and annealing. In some instances, it may be desirable to provide a layer of a metal silicide, such as titanium silicide, over the surface of the polysilicon layer that is to be patterned into the gate electrodes of the embedded DRAM transfer FETs to further reduce the resistivity of the gate electrodes and wiring lines. Because salicide processing would introduce leakage to the transfer FETs, the silicide layer is provided by sputter deposition or CVD deposition and no silicide is provided on the source/drain regions of the transfer FETs. Depending upon the nature of the later thermal processing steps, it may in fact be preferred to not provide a silicide layer on the gate electrodes to limit the diffusion of metals through the gate electrodes. For simplicity, this optional titanium silicide layer is not shown in the drawings. A layer of protective oxide is provided over the polysilicon layer to a thickness of, for example, 500–3000 Å. The oxide capping layer protects the gate electrodes and wiring lines of the embedded DRAM array from processing damage in subsequent etching and implantation steps. Patterning is performed on the multilayer structure to provide polysilicon lines 110 for the transfer FETs 104 and wiring lines 106. The polysilicon lines 110 are covered by similar oxide layers 114. Source/drain regions 118 are typically provided on either side of the gate electrodes to complete the transfer FETs. In most modern embedded DRAM geometries, the source/drain regions have a uniform and moderate level of N-type doping provided by implantation self-aligned to the gate electrode. Typically, the higher levels of doping associated with the use of LDD structures is avoided because of the associated implantation damage to the substrate which can produce leakage. Oxide spacer structures 116 are formed on either side of the gate electrodes and wiring lines to provide further protection for the gate electrodes 104 and wiring lines 106 during subsequent processing and to provide insulation between the conductors of the lower capacitor electrodes and the gate electrodes and wiring lines.

Generally, the logic FETs are formed at about the same time as the transfer FETs of the embedded DRAM array are formed. Depending on the differences introduced between the various FETs, such as differing threshold adjust implantations, gate electrode doping levels, and source/drain doping levels and profiles, some of the processing steps used to form the logic FETs might be shared with the transfer FETs of the embedded DRAM array or with the I/O circuits. Regardless of the particular process flow selected, logic FETs 120 are formed over the active device regions of the substrate by first forming an appropriate gate oxide layer 122. Polysilicon is deposited, doped and patterned to form gate electrodes 124. Preferably, no silicide layer is provided over the polysilicon gate electrode at this stage of processing to accommodate the later use of a salicide process. Oxide spacer structures 126 are formed alongside the polysilicon gate electrodes 124 both to protect the gate electrode during further processing and to facilitate the formation of LDD source/drain regions 128. It is typically preferable to form the source/drain regions 128 of the logic FETs 120 using the LDD structure to address the hot electron problem of small FETs. As such, source/drain regions 128 are formed by first implanting a comparatively light dosage of N-type ions self-aligned to the gate electrode 124 prior to formation of the oxide spacer structures 126. The oxide spacer structures 126 are then provided by blanket depositing a CVD oxide layer to a thickness of approximately 1000–2000 Å and etching back the blanket oxide layer to form the spacer structures 126. A second implantation is then made self-aligned to the spacer structures to complete the implantation of the source/drain regions 128. Subsequent annealing activates the dopants in the source/drain regions 128. It is, of course, likely that the actual logic circuits to be formed will be far more complex than individual FETs. For example, many present logic circuits include both NMOS and PMOS devices in various configurations. However, the illustrated single logic FET is an adequate illustration of the process of the present invention and so the additional complexity of typical logic circuits will not be discussed here.

After the transfer FETs of the embedded DRAM array and logic FETs have been formed, lower capacitor electrodes for the illustrated bit line over capacitor embedded DRAM array are formed. As a preliminary to the capacitor formation process, a layer 129 of a protective material is provided over both the embedded DRAM circuits and the logic circuits. The protective layer provides further protection to the transfer FETs and wiring lines of the embedded DRAM array and protects the logic circuits, including illustrated logic FET 120, during the capacitor formation process. The principle processes from which the logic FETs are protected are the etching processes used to laterally define the polysilicon layers used in the capacitor electrodes. As such, it is desirable for the protective layer 129 to serve as a reliable etch stop to polysilicon etching processes. Although a variety of materials might be used, a particularly preferred protective layer might be an oxide layer having a thickness of between about 300 Å to about 2000 Å because oxide can serve as a reliable etch stop layer for polysilicon etching and because oxides are compatible with other parts of the process flow. Thus, a layer of CVD oxide 129 is deposited over the different portions of the device from, for example, a TEOS source gas, to a thickness of between about 300–2000 Å. A mask is then formed over the protective oxide layer 129 that will be used to define the contact opening to the source/drain region 118 to which the lower capacitor electrode will be connected. The protective oxide layer 129 is etched using, for example, an etchant derived in a plasma process from a fluorine bearing source gas such as $CF_4$ to expose the desired source/drain region. After the contact opening to the source/drain region 128 is opened, providing the device illustrated in FIG. 5, a layer of polysilicon is deposited over the device. Preferably, the polysilicon layer is deposited to a thickness of between about 1500–3500 Å and is doped N-type in situ during deposition. A mask is provided over the polysilicon layer and the polysilicon layer is patterned using, for example, an etchant derived in a plasma process from HCl and HBr source gases to define the lateral extent of the lower capacitor electrodes 130. This etching process is particularly compatible with use of oxide as the protective layer 129 because oxide is an effective etch stop for this polysilicon etch process. Further processing might be performed either before or after the patterning of the polysilicon layer to alter the characteristics of the capacitor electrode. Since it is particularly preferred that the embedded DRAM charge storage capacitor include a high dielectric constant capacitor dielectric, it may for example be desirable to provide at least a surface of the lower capacitor electrode that is adapted for use with the desired high dielectric constant capacitor dielectric. For example, it might be desirable to provide a layer of titanium, titanium nitride or platinum at the surface of the lower capacitor electrode. In other embodiments, it might be desirable to not use doped polysilicon in the lower capacitor electrode and instead use a single layer of conductor such as titanium nitride as the lower capacitor electrode. On the other hand, the illustrated example simply uses doped polysilicon as the lower capacitor electrode 130.

Next, a layer of capacitor dielectric material 132 is provided over the surface of the lower charge storage capacitor electrode 130. In particularly preferred embodiments of the present invention, a high dielectric constant capacitor dielectric material is preferred, such as tantalum pentoxide, barium strontium titanate, another similar oxide material or other high dielectric constant materials. Most preferably, the chosen capacitor dielectric layer 132 has a dielectric constant "k" significantly higher, on the order of about 20–25 or more, than the effective dielectric constant of ONO. In the illustrated embodiment, a capacitor dielectric layer 132 of tantalum pentoxide, nominally $Ta_2O_5$, is deposited in a chemical vapor deposition (CVD) process from a source gas mixture consisting of Ta $(OC_2H_5)_5+O_2$. The tantalum pentoxide capacitor dielectric might be deposited in a high density deposition system such as the LAM 9800 Integrity system to a thickness of between about 20–140 Å. The particular thickness chosen for the capacitor dielectric is preferably thin to maximize the resulting capacitance but sufficiently thick to ensure that the capacitor dielectric layer 132 does not have unacceptable pin holes or an unacceptable breakdown voltage. Because the preferred tantalum pentoxide layer is deposited by CVD, the deposited capacitor dielectric layer 132 will extend over the entire structure. It is the use of such a high dielectric constant material that makes possible the use of a thin, conformal oxide layer as the protective layer 129 shown in FIG. 6 rather than the thicker, planarized oxide layer 42 shown in FIG. 2. The use of the high dielectric constant material allows the use of a simple and substantially planar lower capacitor electrode 130 such as that illustrated in FIG. 6 so that the planarized surface of the FIG. 2 oxide layer 42 is not needed for the formation of a complex capacitor electrode.

Figure 6:
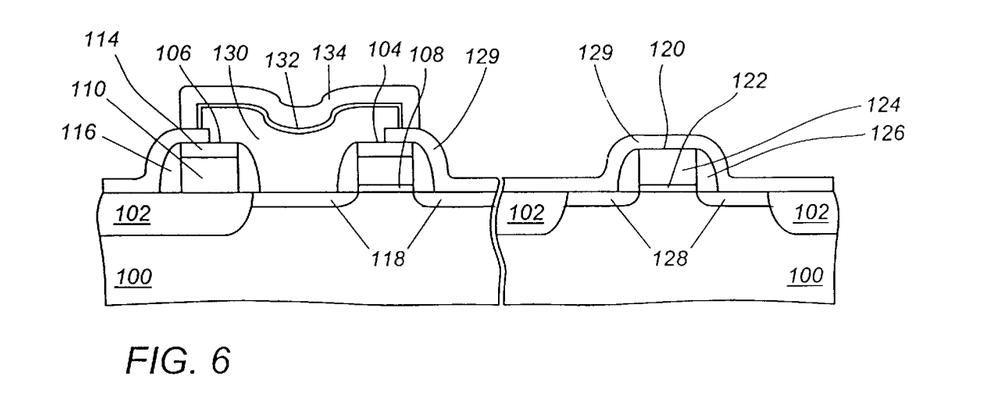
Figure 7:
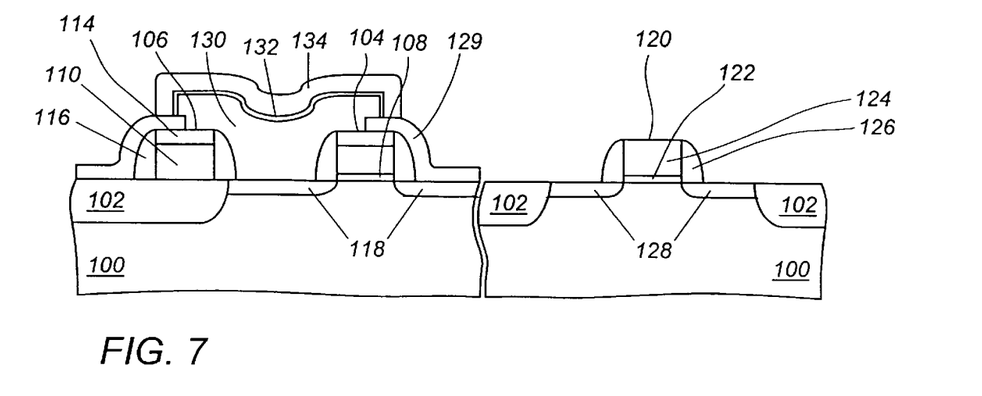
Figure 8:
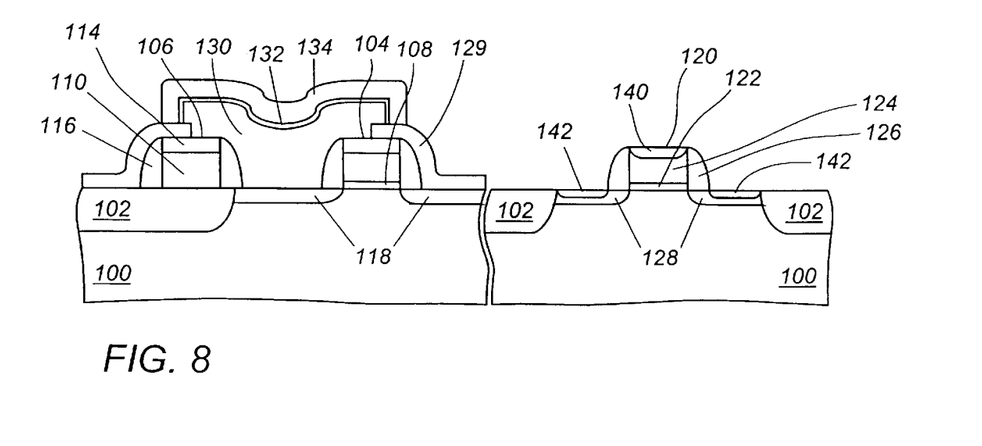

Upper capacitor electrodes are next formed in accordance with preferred embodiments of the present invention to provide the structure shown in FIG. 6. When the preferred tantalum pentoxide capacitor dielectric is used, it is particularly preferred that titanium nitride (TiN) is used to form at least the lower surface of the upper capacitor electrode. Most often, the entire upper capacitor electrode can be formed from titanium nitride due to the high conductivity of titanium nitride. Most preferably, the titanium nitride is deposited over the capacitor dielectric in a low temperature process. Such a low temperature process is preferred because the high dielectric constant capacitor dielectrics preferably used in the present invention typically include oxygen as a constituent element. Thus, any high temperature processes can cause oxide to form at the surface of the lower capacitor electrode 130. Any such oxide layer formed will constitute a reduced capacitance in series with the capacitance provided by the high dielectric constant material, which would undesirably reduce the capacitance of the DRAM charge storage capacitor. Accordingly, the titanium nitride layer is preferably deposited to a thickness of 1000 Å or less using a sputtering process and a relatively low substrate temperature or, more preferably, the titanium nitride layer is deposited in a chemical vapor deposition (CVD) process. Titanium nitride can be deposited by CVD from $TiCl_4+NH_3$ source gases at a comparatively low substrate temperature. The CVD process has the further advantage over sputtering that CVD is much less likely to heat the deposition substrate during the deposition process. Of course, in many embodiments, the upper capacitor electrode might instead be formed from doped polysilicon. Whatever conductor is used, a mask is provided over the conductive layer and the conductive layer is etched to laterally define the extent of the upper capacitor electrode 134 to provide the structure illustrated in FIG. 6. If titanium nitride is used as the upper capacitor electrode, then an etchant derived in a plasma process from a source gas including $Cl_2$ may be used to etch the upper capacitor electrode. If polysilicon is used, either an etchant derived from $Cl_2$ or an etchant derived from HBr and HCl might be used to laterally define the upper capacitor electrode. Any of these etching systems might be used in cooperation with the oxide protective layer acting as an etch stop layer.

After the charge storage capacitor electrode is formed, a mask is provided over the embedded DRAM arrays and the protective oxide layer 129 is removed from above the logic circuits, for example in a dry etching process using an etchant derived in a plasma process from a $CF_4$ source gas. The etching process is continued to expose and clear the gate electrode 124 and the source/drain regions 128. A salicide process is then performed on the logic FETs to provide silicide layers 140, 142 on the polysilicon electrode 124 and on the source/drain regions 128. The salicide process begins by first sputtering a layer of titanium over the surface of the device to a thickness of, for example, 500 Å. This titanium layer is converted into titanium silicide at the surface of the polysilicon gate electrodes and at the exposed portions of the substrate, including the source/drain regions 128, in a two step annealing process. In the first process step, the device is subjected to a rapid thermal anneal (RTA) by heating the device to a temperature of up to about 700° C. for about thirty seconds. The first RTA process is followed by an etch to remove unreacted portions of the titanium layer, leaving behind the titanium silicide, and then the titanium silicide is further processed in a second RTA process to achieve a desired form of the titanium silicide layers. The first RTA step of the process converts the titanium layer into titanium silicide (nominally $TiSi_2$) where the titanium layer is in contact with a silicon (crystalline or polycrystalline) surface during the anneal. A layer of titanium silicide is formed over the polysilicon gate electrode 124 and titanium silicide layers are formed over the source/drain regions 128.

After the initial RTA step, the surface of the device is subjected to a wet etch consisting of $H_2O_2$ and $NH_4OH$ diluted in water to remove unreacted titanium and a variety of undesired titanium compounds from the surface of the device and to expose the oxide 126 of the device. After the unreacted titanium is removed from the device, further processing is necessary to provide suitable silicide layers on the gate electrodes and over the source/drain regions. Most of the titanium silicide formed on the silicon surfaces in the first annealing step described above (RTA at about 700° C. for 30 sec.) will be the relatively high resistivity metastable phase (known as the "C-49" phase) of titanium silicide, which does not have as low of resistivity as is desirable. It is accordingly desirable to expose the device to a second annealing step at a temperature in excess of 750° C. for at least ten seconds to convert the higher resistivity C-49 phase of titanium silicide to the lower resistivity orthogonal phase (known as the "C-54" phase) of titanium silicide. By performing the salicide process for the logic FETs of the exemplary embedded DRAM logic circuit, the relatively brief RTA processes used to form the silicide regions will not unacceptably affect the capacitor dielectric layer 132. The integrated circuit device is then subjected to further processing, including the provision of a number of well known interconnect structures, to complete fabrication.

While the present invention has been described in terms of certain preferred embodiments, those of ordinary skill in the art will appreciate that various modifications and alterations of the methods and structures described herein can be made while not varying from the teachings of the present invention. Accordingly, the present invention is not to be limited to any particular embodiment described herein but the scope of the present invention is instead to be determined from the claims which follow.

What is claimed:

1. A method of making an integrated circuit device including both embedded DRAM and logic circuits on a single substrate, the method comprising the steps of:
   providing a substrate having transfer FETs formed in and on embedded DRAM regions of the substrate and having logic FETs formed in and on logic circuit regions of the substrate;
   providing a conformal protective layer over the transfer FETs and over the logic FETs, the conformal protective layer having about the same thickness over gate electrodes of the logic FETs and over source/drain regions of the logic FETs;
   removing a portion of the conformal protective layer to form a contact opening exposing a source/drain region of one of the transfer FETs;
   providing a lower capacitor electrode in contact with the source/drain region of the one transfer FET and providing a capacitor dielectric layer and a upper capacitor electrode over the lower capacitor electrode to form a charge storage capacitor for the one transfer FET; and
   removing the conformal protective layer from at least portions of the logic circuit regions.

2. The method of claim 1, wherein the lower capacitor electrode extends over a remaining portion of the conformal protective layer along edges of the contact opening.

3. The method of claim 1, wherein the step of providing a lower capacitor electrode comprises the steps of depositing a layer of polysilicon, doping the layer of polysilicon and patterning the layer of polysilicon to define the lower capacitor electrode.

4. The method of claim 3, wherein the lower capacitor electrode extends over a remaining portion of the conformal protective layer along edges of the contact opening.

5. The method of claim 1, wherein the conformal protective layer comprises silicon oxide.

6. The method of claim 1, wherein the step of removing the conformal protective layer from at least portions of the logic circuit regions is a dry etch process.

7. The method of claim 6, wherein the gate electrodes of the logic FETs and the source/drain regions of the logic FETs are exposed to the dry etch process for an approximately equal time period.

8. The method of claim 3, wherein the capacitor dielectric layer has a dielectric constant higher than ONO.

9. The method of claim 8, wherein the capacitor dielectric layer comprises tantalum pentoxide.

10. The method of claim 3, wherein the gate electrodes of the logic FETs and the source/drain regions of the logic FETs are exposed to an etch environment for an approximately equal time period in the process of removing the conformal protective layer from at least portions of the logic circuit regions.

11. The method of claim 10, wherein the etch environment comprises excited fluorine ions.

12. The method of claim 10, wherein the conformal protective layer comprises an oxide of silicon having a thickness of less than 2000 Å.

13. The method of claim 10, further comprising the steps of forming silicide layers on the gate electrodes of the logic FETs and the source/drain regions of the logic FETs after the step of providing a capacitor electrode.

14. The method of claim 1, wherein the capacitor dielectric layer has a dielectric constant substantially higher than ONO.

15. The method of claim 14, wherein the upper capacitor electrode comprises a metal.

16. The method of claim 15, wherein the upper capacitor electrode comprises titanium nitride.

17. The method of claim 14, wherein the lower capacitor electrode comprises a metal.

18. The method of claim 1, wherein the lower capacitor electrode consists essentially of a single layer of polysilicon.

19. The method of claim 18, wherein the capacitor dielectric layer comprises tantalum pentoxide.

20. The method of claim 10, wherein the conformal protective layer comprises silicon oxide.

21. A method of making an integrated circuit device including both embedded memory and logic circuits on a single substrate, the method comprising the steps of:
   providing a substrate having transfer FETs formed in and on embedded memory regions of the substrate and having logic FETs formed in and on logic circuit regions of the substrate;
   providing a conformal protective layer over the transfer FETs and over the logic FETs, the conformal protective layer having about the same thickness over gate electrodes of the logic FETs and over source/drain regions of the logic FETs;
   removing a portion of the conformal protective layer to form a contact opening exposing a source/drain region of one of the transfer FETs;
   providing a lower capacitor electrode, a capacitor dielectric layer, and a upper capacitor electrode to form a charge storage capacitor coupled to the source/drain region of the one transfer FET; and
   removing the conformal protective layer over the logic circuit regions.

22. The method of claim 21, wherein the conformal protective layer comprises silicon oxide, wherein the lower capacitor electrode and the upper capacitor electrode are defined in etching processes which use the conformal protective layer as an etch stop layer.

23. The method of claim 22, wherein the step of removing the conformal protective layer from at least portions of the logic circuit regions is a dry etch process.

24. The method of claim 21, wherein the capacitor dielectric layer has a dielectric constant substantially higher than ONO.

25. The method of claim 21, wherein the capacitor dielectric layer comprises tantalum pentoxide.

26. The method of claim 21, wherein the gate electrodes of the logic FETs and the source/drain regions of the logic FETs are exposed to an etch environment for an approximately equal time period in the process of removing the conformal protective layer from the logic circuit regions.

27. The method of claim 26, wherein the etch environment comprises excited fluorine ions.

28. The method of claim 26, further comprising the steps of forming silicide layers on the gate electrodes of the logic FETs and the source/drain regions of the logic FETs after the step of removing the conformal protective layer.

* * * * *